(12) United States Patent
Butler et al.

(10) Patent No.: US 8,294,473 B2
(45) Date of Patent: Oct. 23, 2012

(54) CABLE DETECTOR

(75) Inventors: Robert Karl Butler, Issaquah, WA (US); Vijaya Ceekala, San Jose, CA (US); Jim Wieser, Pleasanton, CA (US)

(73) Assignee: Texas Instruments Incorporated, Dallas, TX (US)

( * ) Notice: Subject to any disclaimer, the term of this patent is extended or adjusted under 35 U.S.C. 154(b) by 574 days.

(21) Appl. No.: 12/423,704

(22) Filed: Apr. 14, 2009

(65) Prior Publication Data

US 2009/0309611 A1    Dec. 17, 2009

Related U.S. Application Data

(60) Provisional application No. 61/044,862, filed on Apr. 14, 2008.

(51) Int. Cl.
*G01R 31/02* (2006.01)

(52) U.S. Cl. .............. 324/538; 327/58; 327/59; 702/58; 370/252

(58) Field of Classification Search ................ 324/539; 327/387
See application file for complete search history.

(56) References Cited

U.S. PATENT DOCUMENTS

| | | | | |
|---|---|---|---|---|
| 4,163,909 A * | 8/1979 | Harr | | 327/59 |
| 4,933,869 A * | 6/1990 | Gareis et al. | | 702/58 |
| 5,179,341 A * | 1/1993 | Whiteside | | 324/523 |
| 5,488,306 A * | 1/1996 | Bonaccio | | 324/539 |
| 6,803,811 B2 * | 10/2004 | Hester | | 327/552 |
| 7,003,043 B2 * | 2/2006 | Casper et al. | | 375/257 |
| 7,127,220 B2 * | 10/2006 | Abrams et al. | | 455/127.5 |
| 7,525,347 B1 * | 4/2009 | Luo | | 327/58 |
| 7,652,483 B2 * | 1/2010 | Huang et al. | | 324/534 |
| 7,859,315 B2 * | 12/2010 | Nakamori et al. | | 327/109 |
| 7,884,615 B1 * | 2/2011 | Lo et al. | | 324/533 |
| 2003/0026391 A1 * | 2/2003 | Kamali et al. | | 379/27.01 |
| 2003/0141873 A1 * | 7/2003 | Bolz | | 324/380 |
| 2004/0062361 A1 * | 4/2004 | Kamali et al. | | 379/1.04 |
| 2005/0104602 A1 * | 5/2005 | Bartley et al. | | 324/539 |
| 2006/0181283 A1 * | 8/2006 | Wajcer et al. | | 324/539 |
| 2008/0116900 A1 * | 5/2008 | Crockett et al. | | 324/539 |
| 2009/0024271 A1 * | 1/2009 | Inoue | | 701/29 |
| 2009/0108907 A1 * | 4/2009 | Butler | | 327/387 |
| 2009/0128161 A1 * | 5/2009 | Xu et al. | | 324/539 |

* cited by examiner

*Primary Examiner* — Timothy J Dole
*Assistant Examiner* — Benjamin M Baldridge
(74) *Attorney, Agent, or Firm* — Alan A.R. Cooper; Wade James Brady III; Frederick J. Telecky, Jr.

(57) ABSTRACT

A cable detector includes one or more peak detectors that detect when a termination impedance is missing from the output of a line driver. A peak detection signal is asserted when signals on a transmission line exceed a threshold level. A fault condition is asserted when the peak detection signal is asserted for a sufficient length of time to indicate that an actual fault is detected. The time period required for detecting a lost or missing line termination is longer than the time periods for any one of the pathological conditions to avoid a false positive detection. After the peak detection signal is de-asserted, the fault condition will be maintained until another sufficient length of time has expired without a peak detection.

12 Claims, 8 Drawing Sheets

US 8,294,473 B2

CABLE DETECTOR

CROSS REFERENCE TO RELATED APPLICATIONS

This application claims the benefit under 35 U.S.C. §119 (e) of the U.S. provisional application No. 61/044,862, filed Apr. 14, 2008.

FIELD OF THE INVENTION

The present disclosure generally relates to a fault detection system that determines if a cable is properly coupled to a driver output. More particularly, the present disclosure relates to a technique for monitoring the driver output levels for a driver to determine if the signal amplitudes exceed expected values for a sufficient duration to qualify as a fault condition.

BACKGROUND

Cable systems utilize transmission lines to transfer high speed signals such as video signals. Example transmission lines include coaxial cables and twisted pairs of wires, and example video signals include analog and digital video signals. In a typical cable system, a cable driver is used to drive the transmission line so that signals can be properly interpreted by the receiving system.

Coaxial cables typically have a nominal line impedance of either fifty ohms (50Ω) or seventy-five ohms (75Ω), while twisted pairs of transmission lines typically have a nominal line impedance of about one-hundred ohms (100Ω). Each transmission line needs to be terminated with another impedance that is matched in value to the nominal line impedance (e.g., 50 Ω, 75Ω or 100Ω). Failure to provide a properly valued terminating impedance may result in signal reflections from the receiver end of the transmission line back to the driver at the other end of the transmission line. Signal reflections may also occur when there is a break in the transmission line or a required ground connection is missing.

For one example driver, a two (2) volt peak-to-peak signal is driven onto a transmission line with a characteristic impedance of 75Ω. When properly terminated with an impedance of 75Ω, the total impedance seen by the driver looking into the transmission line is 150Ω. At the receiving end of the transmission line, the signal level is ideally one (1) volt peak-to-peak. However, when the terminating impedance is missing or the signal ground is broken at the receiving end, the voltage at the receiving end will be up to two (2) volts peak-to-peak, which may fluctuate due to signal reflections from the high impedance of the open circuit condition. When the terminating impedance is incorrect (e.g., 25Ω) for the 75Ω line, the voltage will be approximately half the expected amplitude lower, which may also fluctuate due to signal reflections from the mismatched impedance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
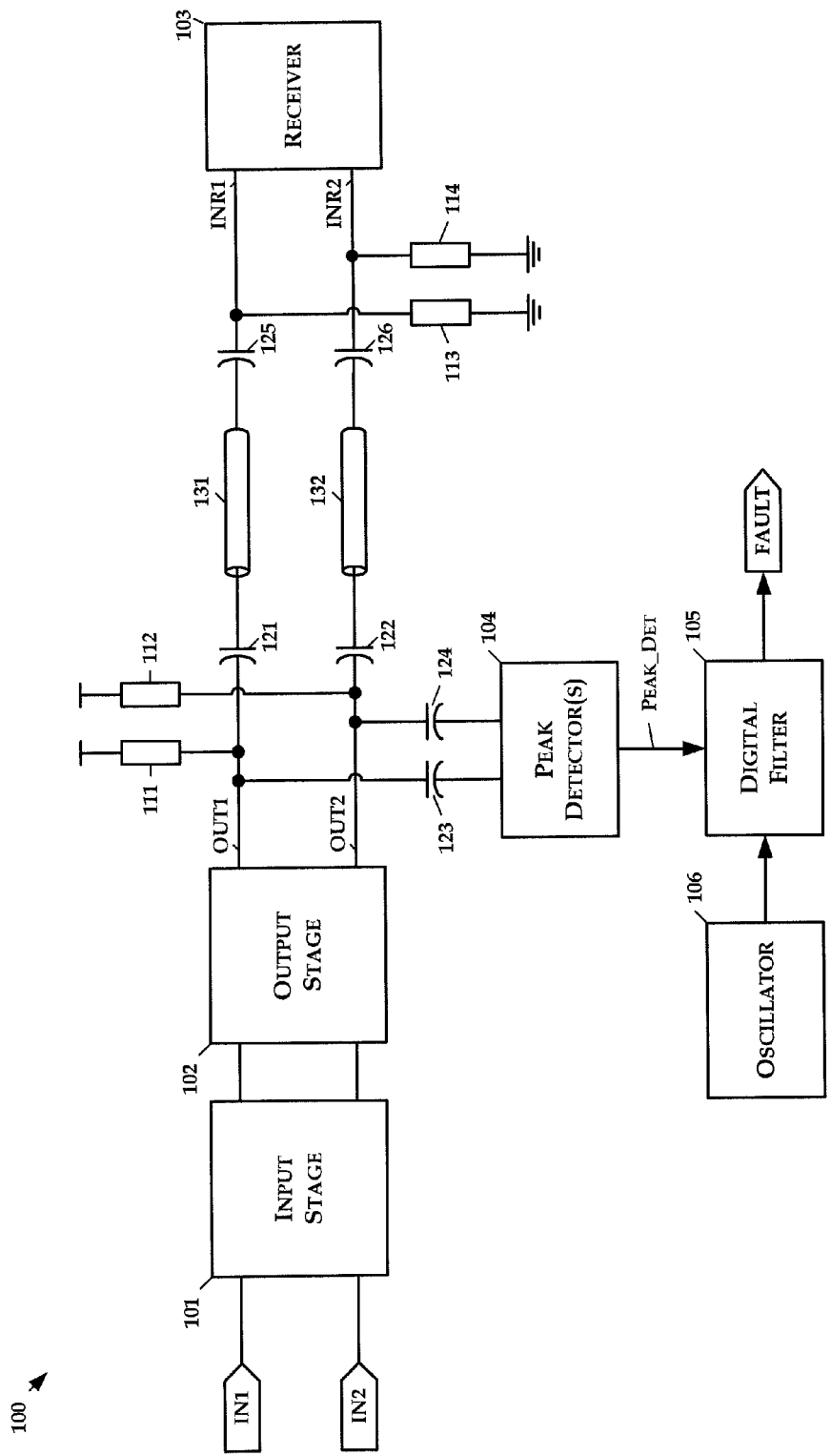
FIG. 1 is a schematic diagram illustrating an example operating environment for a line driver including a cable detector that is tolerant of pathological data patterns.

Embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope. Embodiments may be practiced as methods, systems, circuits or devices. The various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to a cable detector that is able to detect when a proper termination impedance is coupled to the output of a line driver. One or more peak detectors monitor signals from the transmission line and assert a peak detection signal when a signal on a transmission line exceeds an expected signal level. A fault condition is asserted when the peak detection signal is asserted for a sufficient length of time to indicate that an actual fault is detected, and not a false positive for a pathological signal. After the peak detection signal is de-asserted, the fault condition will be maintained until another sufficient length of time has expired without a peak detection. In one example, a digital topology is used to evaluate the peak detection signal, where the length of time required for detection of a fault or for clearing a fault is determined from one or more counter circuits. In another example, an analog topology is used to evaluate the peak detection signal, where the length of time required for detection of a fault or for clearing a fault is determined from one or more time constants associated with capacitor circuits.

FIG. 1 is a schematic diagram illustrating an example operating environment (100) for a line driver including a cable detector that is tolerant of pathological data patterns, arranged in accordance with at least some features of the present disclosure. The schematic drawing illustrates an input stage circuit (101), an output stage circuit (102), a receiver circuit (103), one or more peak detector circuits (104), a digital filter (105), an oscillator circuit (106), two pull-up circuits (111 and 112), two pull-down circuits (113 and 114), and four capacitor circuits (121-124).

The input stage circuit (101) includes two input terminals (IN1 and IN2), and two output terminals. The output terminals of the input stage circuit are coupled to corresponding input terminals of the output stage circuit (102). The output stage circuit (102) also includes two output terminals (OUT1 and OUT2), which are each coupled to a corresponding one of the pull-up circuits (111 or 112). Capacitor circuits 121 and 122 are arranged to AC couple a respective one of OUT1 and OUT2 to transmission lines 131 and 132. Capacitor circuits 125 and 126 are arranged to AC couple signals from a respective one of transmission lines 131 and 132 to a corresponding one of the input terminals (INR1 or INR2) of the receiver circuit (103). Pull-down circuits 113 and 114 are coupled to a respective one of the input terminals (INR1 or INR2) of the receiver circuit (103). The peak detectors circuit or circuits (104) are coupled to the output terminals (OUT1 and OUT2) of the output stage circuit (102) via capacitors 123 and 124, respectively. The output of the peak detector(s) circuit (104) corresponds to signal PEAK_DET, which is coupled to an input terminal of the digital filter (105). The digital filter also includes another input terminal that is coupled to an output of the oscillator circuit (106), and an output terminal that is arranged to selectively generate a fault indicator signal (FAULT).

The above described configuration includes a line driver circuit that is comprised of the input stage circuit (101), the output stage circuit (102), the peak detector(s) circuit (104), the digital filter (105) and the oscillator circuit (106). In operation, input signals are applied to IN1 and/or IN2, and output signals are driven onto the transmission lines (131, 132) from the output stage circuit (102) through capacitor circuits 121 and 122. The receiver circuit (103) is arranged to monitor input terminals INR1 and INR2 to receive signals transmitted over the transmission lines through capacitor circuits 125 and 126. In addition to providing a DC level to their respective input or output terminals, pull-down circuits 113 and 114 can be arranged to provide a terminating impedance for transmission lines 131 and 132 in one direction (e.g., from transmitter to receiver), while pull-up circuits 111 and 112 can be arranged to provide a terminating impedance in the other direction (from receiver to transmitter).

The peak detector(s) circuits (104) are arranged to monitor the signals at output terminals OUT1 and OUT2 to determine whether or not a signal peak is detected. The oscillator circuit (106) provides a time base for the digital filter (105). The digital filter (105) monitors the output signal (PEAK_DET) from peak detector(s) circuit 104 to determine if the detected signal peak has persisted long enough to qualify as a fault condition, and asserts the fault indicator signal (FAULT) when the detected signal peak persists for the requisite time. The digital filter can also determine when to de-assert the fault indicator signal when the peak is no longer detected for another requisite time after the fault condition occurred.

The described line driver circuits, methods and techniques have the ability to detect whether a cable (i.e., a transmission line) or a cable line termination is attached to the output of the cable driver circuit. The line detector capability can be integrated inside the line driver circuits so that no external components would be required in an integrated circuit implementation. In practice, the output of the line driver circuit is either terminated locally (e.g., pull-up circuits 111 or 112) or through a matched impedance (e.g., a 75Ω line termination from pull-down circuits 113 or 114) located at the far end (i.e., the receiver circuit end) of the cable. To detect the presence of the transmission line (131 or 132), the amplitude of the signal from the output terminals (OUT1 and OUT2) of the line driver circuit is evaluated by the peak detector(s) circuit (104) through the capacitor circuits 123 and 124.

In one example, the outputs of the line driver circuit are implemented as current mode open collector drivers, and 75Ω pull-up resistors to a high supply (e.g., VCC) are used for pull-up circuits 111 and 112 at output terminals OUT1 and OUT2. The described example requires that the pull-down circuits (113 and 114) are 75Ω resistors that are coupled to ground for proper impedance matched termination. The total impedance looking out from the cable driver to the transmission lines is 75Ω in parallel with 75Ω or 37.5Ω. To achieve a single ended output of 800 mV peak-to-peak, an output drive current of 21.3 mA is required. However, when the transmission line (e.g., the cable) is either not attached or the terminating impedance (113 or 114) is missing, the impedance looking out from the cable driver appears as 75Ω, resulting in a signal peak-to-peak level of 1.6V, which is twice the expected amplitude for the driver output.

The illustrated line driver circuit can either use a single peak detector circuit that is multiplexed between output terminals OUT1 and OUT2, or separate peak detector circuits that are each coupled to a respective one of output terminals OUT1 and OUT2. The peak detect circuit is arranged to compare the peak amplitude versus a predetermined threshold level, which may be a fixed level or an adjustable level. The peak detection circuit(s) is AC coupled to the output terminals through capacitor circuits 123 and 124. DC coupling may optionally be used instead of AC coupling with a carefully designed peak detector circuit. The AC coupling through capacitor circuits permit the use of a simple peak detect circuit at the expense of adding a data dependence characteristic.

The effective capacitance values of the AC coupling capacitor circuits (e.g., 123 and 124) are ideally small for reduced die area (in integrated circuit implementations) and minimal parasitic loading effects on the output terminals. However, small AC coupling capacitor values have associated time constants that are faster than some patterns that can be observed in the transmitted data. For example, SMPTE (Society of Motion Picture and Television Engineers) coded signals use a simple ten (10) bit scrambler to randomize the edge transitions in the signals. A pathological condition may occur using this 10-bit scrambler that can cause some data patterns to repeat (e.g., 19-1 patterns and 1-19 patterns). According to one recommended practice, these patterns can only exist for up to two (2) video lines (or 50 usec) before the scrambler will fall out of the pathological condition. Additionally, some normal data patterns can cause the nominal DC biasing of the AC coupling capacitors to drift.

In consideration of the present disclosure it has been realized that a missing cable termination is a very slow condition to detect (on the order of more than 1 sec), whereas the data dependent and pathological signals are very fast conditions (less than 50 usec). The cable detection circuits and methods described herein use filtering (e.g., a digital filtering or an analog filtering) to avoid problems from data dependent conditions by filtering the peak detection at a very slow rate. For example, a digital filter can use a very slow oscillator/clock signal that runs in a range of about fourteen kilo-Hertz (14 KHz) to about thirty kilo-Hertz (30 KHz), depending on process variations. Alternatively, an analog filter with a long integration time can be used. Both of these varieties will be described in more detail below.

Figure 2:
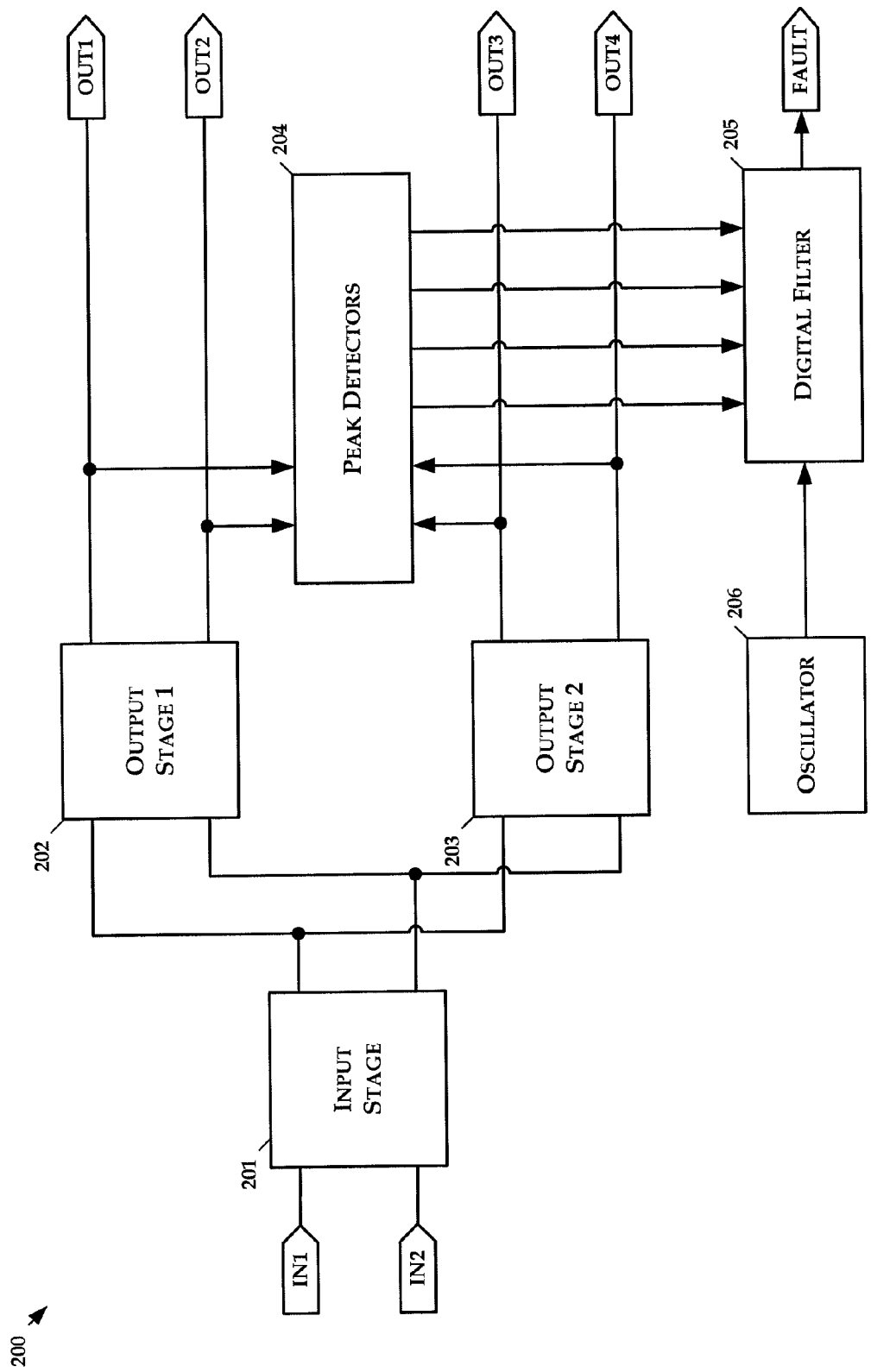
FIG. 2 is a block diagram illustrating an example dual output line driver including a cable detector that is tolerant of pathological data patterns.

FIG. 2 is a block diagram illustrating an example dual output line driver (200) including a cable detector that is tolerant of pathological data patterns, arranged in accordance with at least some features of the present disclosure. Dual output line driver 200 includes an input stage (201), two output stages (202 and 203), peak detectors (204), a digital filter (205), and an oscillator (206). The overall design is substantially similar to that shown in FIG. 1. However, FIG. 2 shows that the output terminal from the input stage (201) is coupled to two output stages (202 and 203), where each output stage is arranged to drive a separate set of transmission lines at terminals OUT1, OUT2 and OUT3, OUT4. The peak detectors are arranged to monitor both sets of output terminals to identify peaks in the signal levels for analysis by the digital filter (205) to determine if a fault condition exists.

Figure 3:
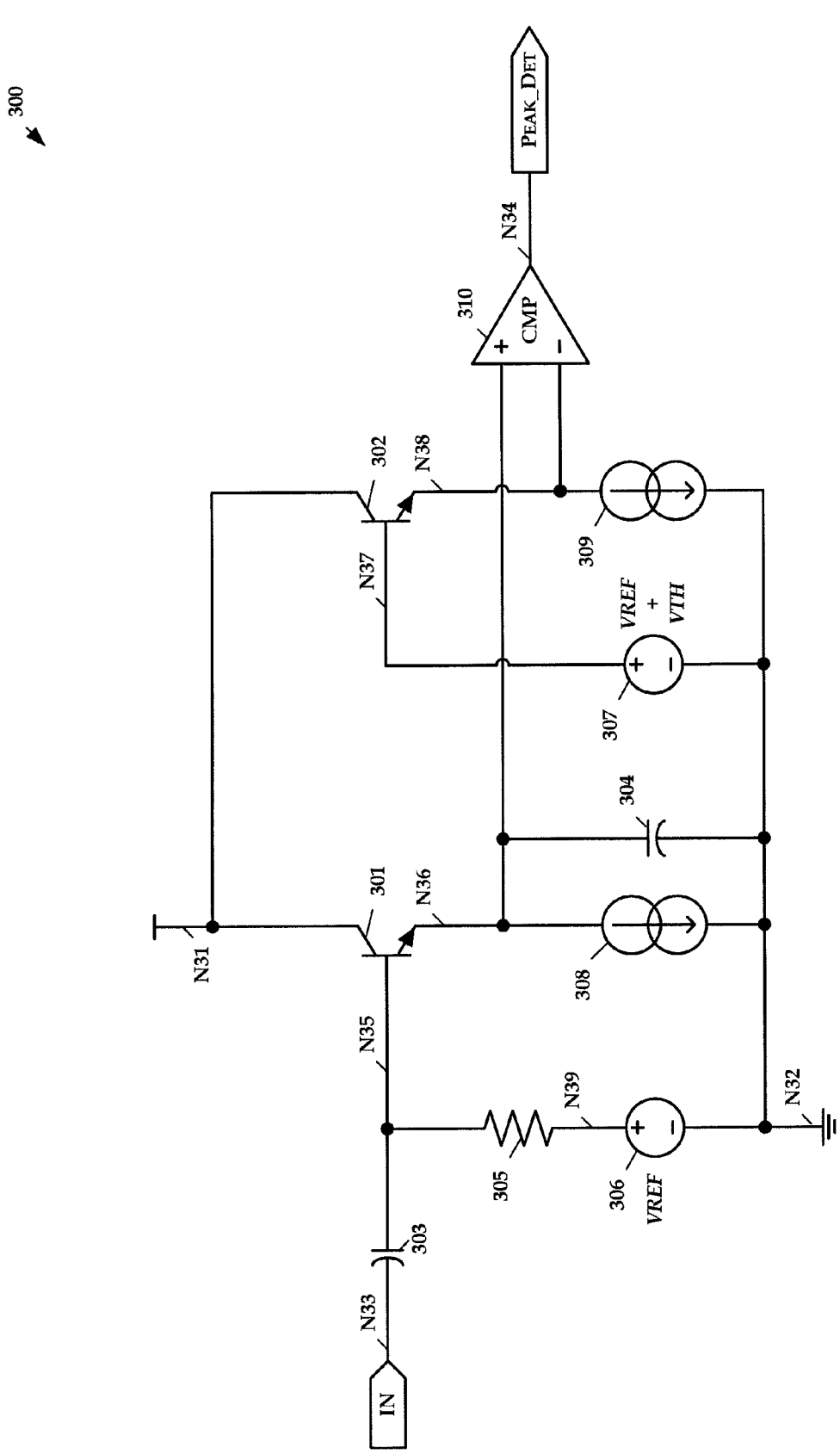
FIG. 3 is a schematic diagram illustrating a detailed example of a peak detector circuit for a line driver such as shown in FIG. 1 or FIG. 2.

FIG. 3 is a schematic diagram illustrating a detailed example of a peak detector circuit (300) for a line driver such as shown in FIG. 1 or FIG. 2, arranged in accordance with at least some aspects of the present disclosure. Peak detector circuit 300 includes two transistor circuits (301 and 302), two capacitor circuits (303 and 304), one resistor (305), two voltage sources (306 and 307), two current sources (308 and 309), and a comparator circuit (310).

A first node (N31) corresponds to a positive power supply terminal (e.g., VCC), while a second node (N32) corresponds to a negative power supply terminal (e.g., VEE or GND). A third node (N33) corresponds to an input terminal (IN) for the peak detector circuit (300), while a fourth node (N34) corresponds to an output terminal for the peak detector circuit (300). Transistor circuit 301 includes a first terminal coupled to the first node (N31), a second terminal coupled to a sixth node (N36), and a control terminal coupled to a fifth node (N35). Transistor circuit 302 includes a first terminal coupled to the first node (N31), a second terminal coupled to an eighth node (N38), and a control terminal coupled to a seventh node (N37). Capacitor circuit 303 is coupled between the third node (N33) and the fifth node (N35). Capacitor circuit 304 is coupled between the sixth node (N36) and the second node (N32). Resistor circuit 305 is coupled between the third node (N33) and a ninth node (N39). Voltage source 306 is coupled between the ninth node (N39) and the second node (N32), and has a value corresponding to VREF. Voltage source 307 is coupled between the seventh node (N37) and the second node (N32), and has a value corresponding to the sum (VREF+VTH). Current source 308 is coupled between the sixth node (N36) and the second node (N32). Current source 309 is coupled between the eighth node (N38) and the second node (N32). Comparator circuit 310 includes a non-inverting input coupled to the sixth node (N36), an inverting input coupled to the eighth node (N38), and an output coupled to the fourth node (N34).

In operation, a signal (IN) is received from the output terminal from an output stage (e.g., see OUT1 and OUT2 from FIG. 1 or FIG. 2) at node N33, and AC coupled via capacitor circuit 303 to node N35. Voltage source 306 and resistor circuit 305 are arranged to bias transistor circuit 301 to operate as a follower circuit with an operating current that is set by current source 308. Signals from node N33 will result in additional base current (IB301) being driven into transistor circuit 301, which generates an excess emitter current (IE301) that corresponds approximately to the additional base current (IB301) multiplied by the forward gain (Beta301) of transistor circuit 301. The nominal voltage stored on capacitor circuit 304 is set by VREF−VBE301, where VBE301 is determined by the forward bias voltage drop of transistor circuit 301. The voltage on capacitor circuit 304 is increased by the excess current (1+Beta301)*IB301 from the emitter of transistor circuit 301 based on the value of capacitor circuit 304 and the total integration time (t).

Transistor circuit 302 is biased by voltage source 307 and current source 309 to operate as a follower circuit, where transistor circuits 302 and 301 are matched to one another, and where current sources 308 and 309 are matched to one another. The voltage observed at node N38 will be given as the quantity (VREF+VTH−VBE302), where VBE302 and VBE301 should match one another when node N35 has a voltage corresponding to VTH+VREF. Thus, comparator circuit 310 will have an output corresponding to a logic 0 level when the voltage at node N35 is below (VTH+VREF), and an output corresponding to a logic 1 level when the voltage at node N35 is above (VTH+VREF). When the input signal level at node N33 exceeds VTH, the peak detection signal (PEAK_DET) will be asserted by comparator circuit 310, and deasserted by comparator circuit 310 when the signal level at node N33 is below VTH.

Figure 4:
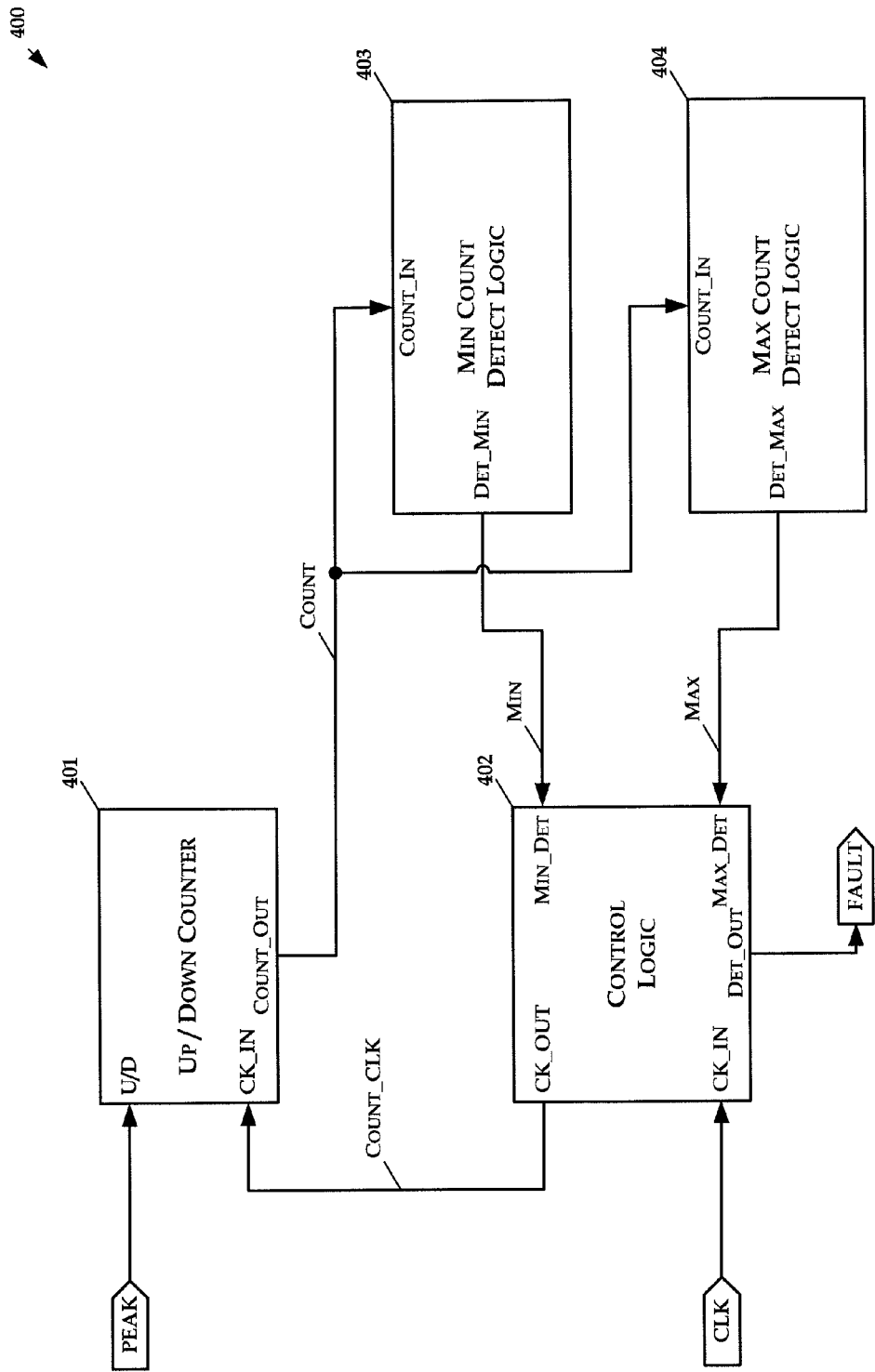
FIG. 4 is a block diagram illustrating a detailed example of a digital filter for a line driver such as shown in FIG. 1 or FIG. 2.

FIG. 4 is a block diagram illustrating a detailed example of a digital filter (400) for a line driver such as shown in FIG. 1 or FIG. 2, arranged in accordance with at least some aspects of the present disclosure. Digital filter 400 includes an up/down counter (401), a control logic (402), a minimum count detection logic (403), and a maximum count detection logic (404).

The control logic (402) includes a first input terminal (CK_IN) that is arranged to receive a clock signal (CLK), a second input terminal (MIN_DET) that is arranged to receive a minimum count detection signal (MIN), a third input terminal (MAX_DET) that is arranged to receive a maximum count detection signal (MAX), a first output terminal (CK_OUT) that is arranged to provide a counter clock signal (COUNT_CLK), and a second output terminal (DET_OUT) that is arranged to provide a fault detection signal (FAULT). The up/down counter (401) includes a first input terminal (U/D) that is arranged to receive a peak detection signal (PEAK), a second input terminal (CK_IN) that is arranged to receive the counter clock signal (COUNT_CLK), and an output terminal (COUNT_OUT) that is arranged to provide a count signal (COUNT). The minimum count detection logic (403) includes an input terminal (COUNT_IN) that is arranged to receive the count signal (COUNT), and an output terminal (DET_MIN) that is arranged to provide the minimum count detection signal (MIN). The maximum count detection logic (404) includes an input terminal (COUNT_IN) that is arranged to receive the count signal (COUNT), and an output terminal (DET_MAX) that is arranged to provide the maximum count detection signal (MAX).

The counter clock signal (COUNT_CLK) is generated by the control logic (402) in response to the clock signal (CLK) as a multiple thereof. For example, the counter clock signal (COUNT_CLK) can have a period that is any appropriate multiple (0.25×, 0.5×, 1×, 1.5×, 2×, 4×, 8×, etc.) of the period of the clock signal (CLK). In a simplest implementation, the clock signal (CLK) is simply coupled to the clock input (CK_IN) of the up/down counter (401) and the control logic (402) does not alter the clock signal (CLK).

The up/down counter (401) is arranged to monitor the peak signal (PEAK) to determine if a peak condition has been detected. The output of the up/down counter, which corresponds to COUNT, will have an increasing counter value when a peak is detected during an edge transition of COUNT_CLK, and a decreasing counter value when no peak is detected during an edge transition of COUNT_CLK. In some examples, the up/down counter is arranged to provide a rising edge evaluation of PEAK. In some other examples, the up/down counter is arranged to provide a falling edge evaluation of PEAK. In still other examples, the up/down counter is arranged to provide an evaluation of PEAK at a time when COUNT_CLK has a logic 1 value. In yet other examples, the up/down counter is arranged to provide an evaluation of PEAK at a time when COUNT_CLK has a logic 0 value.

The minimum count detect logic (403) is arranged to evaluate COUNT to determine if the value is below a minimum count level. MIN is asserted by the minimum count detect logic (403) when COUNT is below the minimum count level, and MIN is de-asserted by the minimum count detect logic (403) when COUNT is above the minimum count level.

The maximum count detect logic (404) is arranged to evaluate COUNT to determine if the value has exceeded a maximum count level. MAX is asserted by the maximum count detect logic (404) when COUNT is above the maximum count level, and MAX is de-asserted by the maximum count detect logic (404) when COUNT is below the maximum count level.

For each rising edge of the clock signal (CLK), the control logic (402) samples MAX to determine if a fault has occurred in the system. When the maximum count detect logic (404) detects that COUNT has reached the maximum count level (i.e., a positive terminal count), the termination impedance for the transmission line is flagged as missing and FAULT is asserted. FAULT will remain asserted until the minimum count detect logic (403) detects that COUNT has reached a minimum count level (i.e., a negative terminal count).

One example pathological condition occurs when 19 logic "1" values are followed by a single logic "0" value in a repeating pattern. Another example pathological condition occurs when 19 logic "0" values are followed by a single logic "1" value in a repeating pattern. The time periods required for detecting a lost or missing line termination must be longer than the time periods for any one of the pathological conditions to avoid a false positive detection. Regular errors due to the data pattern are more random and the pathological condition is significantly less frequent.

The described blocks in FIG. 4 are merely one illustrative example, where each block is a functional partition. However, the described functional partitions may be combined or separated into additional functional partitions as may be desired. Moreover, the described functional partitions can be implemented as separate physical blocks or combined physical blocks as may be desired. In some examples, the functions of the up/down counter (401), the minimum count detect logic (403), and the maximum count detect logic (404) can be combined into a single logic block. In some other examples, the minimum count detect logic (403) and the maximum count detect logic (404) are each implemented as up/down counters with present limits, and up/down counter 401 is eliminated. Additional examples are also contemplated without departing from the spirit of the present disclosure, where the overall functions described herein are encompassed in different physical forms.

Figure 5:
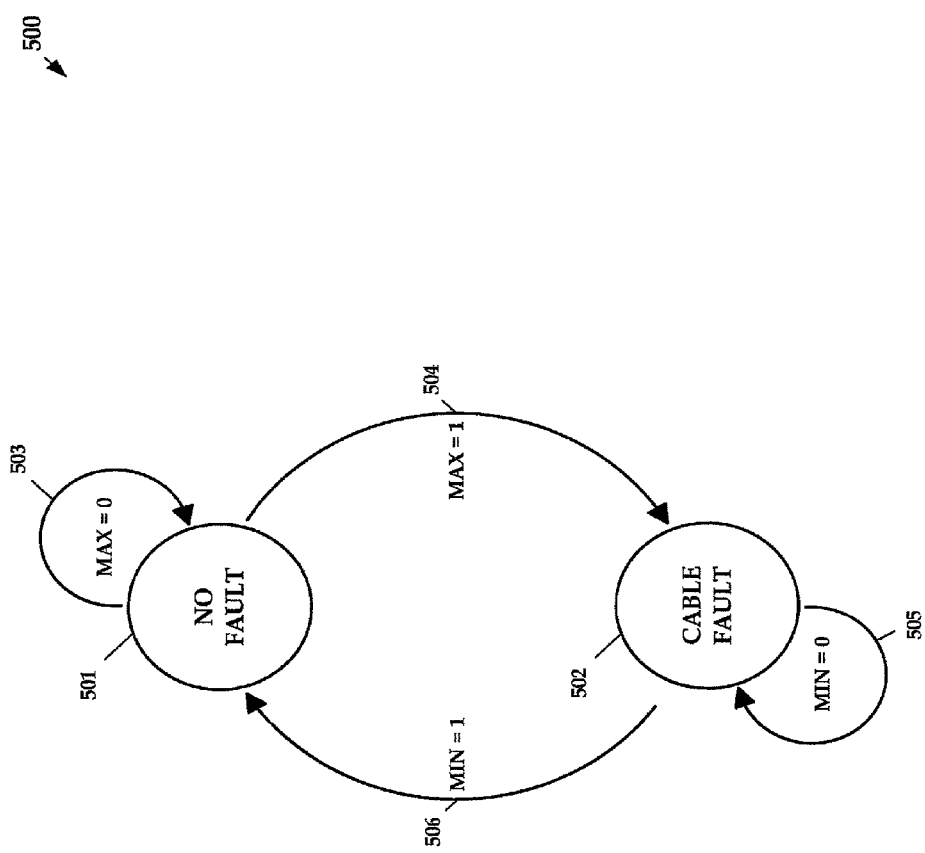
FIG. 5 is a state machine diagram for an example control logic for a digital filter such as shown in FIG. 4.

FIG. 5 is a state machine diagram for an example control logic for a digital filter such as shown in FIG. 4, arranged in accordance with at least some features of the present disclosure.

A no fault state (501) is the initial condition of the control logic. When COUNT has not exceeded the maximum count level (MAX=0), the control logic remains in the no fault condition as shown by transition 503. Once COUNT exceeds the maximum count level (MAX=1) the control logic changes from the no fault state (501) to the cable fault state (502) as shown by transition 504. The control logic will remain in the cable fault state (502) when COUNT has not reached the minimum count level (MIN=0) as shown by transition 505. Once COUNT reaches the minimum count level (MIN=1) the control logic changes from the cable fault state (502) to the no fault state (501) as shown by transition 506.

Figure 6:
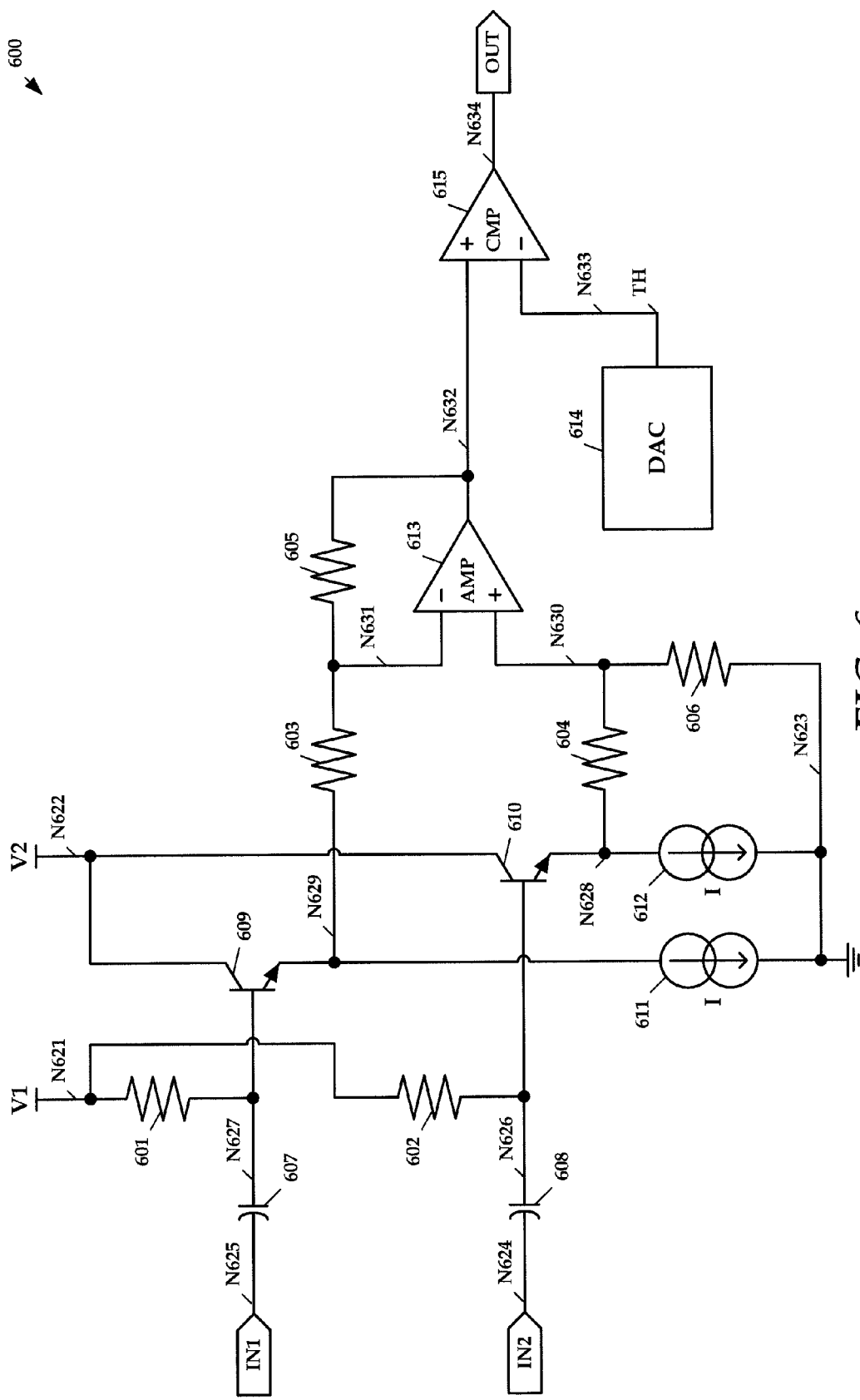
FIG. 6 is schematic diagram illustrating another example implementation for a line diver circuit using a dual peak detector circuit topology.

FIG. 6 is schematic diagram illustrating another example implementation for a line diver circuit (600) using a dual peak detector circuit topology arranged in accordance with at least some aspects of the present disclosure. Line driver circuit 600 includes six resistor circuits (601-606), two capacitor circuits (607 and 608), two transistor circuits (609 and 610), two current sources (611 and 612), an amplifier circuit (613), a digital-to-analog converter (DAC) circuit (614), and a comparator circuit (615).

Resistor circuit 601 is coupled between a first node (N621) and a seventh node (N627). Resistor circuit 602 is coupled between the first node (N621) and a sixth node (N626). Resistor circuit 603 is coupled between a ninth node (N629) and an eleventh node (N631). Resistor circuit 604 is coupled between an eighth node (N628) and a tenth node (N630). Resistor circuit 605 is coupled between the eleventh node (N631) and a twelfth node (N632). Resistor circuit 606 is coupled between the tenth node (N630) and a third node (N623). Capacitor circuit 607 is coupled between a fifth node (N625) and the seventh node (N627). Capacitor circuit 608 is coupled between a fourth node (N624) and the sixth node (N626). Transistor circuit 609 includes a first terminal that is coupled to a second node (N622), a second terminal that is coupled to the ninth node (N929) (N629), and a control terminal that is coupled to the seventh node (N627). Transistor circuit 610 includes a first terminal that is coupled to the second node (N622), a second terminal that is coupled to the eighth node (N628), and a control terminal that is coupled to the sixth node (N626). Current source 611 is coupled between the ninth node (N629) and the third node (N623). Current source 612 is coupled between the eighth node (N628) and the third node (N623). Amplifier circuit 613 includes a non-inverting input terminal that is coupled to the eleventh node (N631), an inverting input terminal that is coupled to the tenth node (N630), and an output terminal that is coupled to the twelfth node (N632). DAC circuit 614 includes an output terminal that is coupled to a thirteenth node (N633). Comparator circuit 615 includes a non-inverting input terminal that is coupled to the twelfth node (N632), an inverting input terminal that is coupled to the thirteenth node (N633), and an output terminal that is coupled to a fourteenth node (N634).

In operation, a positive power supply voltage is applied to the fist node (N621) as voltage V1, a positive power supply voltage is applied to the second node (N622) as voltage V2, and a negative power supply voltage (or ground return) is applied to the third node (N623). A first input signal (IN1) is applied to the fifth node (N625), a second input signal (IN2)

is applied to the fourth node (N624), and an output signal (OUT) is generated at the fourteenth node (N634) by comparator circuit 615.

Transistor circuit 609 is arranged to operate as a follower circuit with current source 611, while transistor circuit 610 is arranged to operate as a follower circuit with current source 612. Resistor circuits 601 and 602 are arranged to operate as pull-up circuits that define the DC bias condition for the control terminals of transistor circuits 609 and 610, respectively. The first input signal (IN1) is AC coupled to the control terminal of transistor circuit 609 via capacitor circuit 607. The second input signal (IN2) is AC coupled to the control terminal of transistor circuit 610 via capacitor circuit 608. The signal at node N629 corresponds to the difference between the first input signal (IN1), which is AC coupled to node N627 via capacitor circuit 607, and the forward bias voltage (VBE) of transistor circuit 609, or VN629=[V1+IN1−VBE609]. The signal at node N628 corresponds to the difference between the second input signal (IN2) and the forward bias voltage (VBE) of transistor circuit 610, or VN628=[V1+IN2−VBE610]. Ideally, transistor circuits 609 and 610 are matched to one another and under identical operating conditions (e.g., matched current sources 611-612, matched resistor circuits 601-602, matched thermally, etc.). Under these ideal conditions, VX=VBE609=VBE610, VN639=V1+IN1−VX, and VN628=V1+IN2−VX.

Amplifier circuit 613 is arranged to cooperate with resistor circuits 603 and 605 to operate as an inverting amplifier with respect to the signal (VN629) received at node N629. Amplifier circuit 613 is arranged to cooperate with resistor circuits 604 and 606 to operate as a non-inverting amplifier with respect to the signal (VN628) received at node N628. Thus, the signal at node N632 is given as: [VN629*GNI−VN628*GIN], where GNI is the non-inverting gain factor, and GIN is the inverting gain factor. For equal gain factors (G=GNI=GIN), the signal (e.g., VN632) at node N632 is given as: VN632=(IN2−IN1)*G. DAC circuit 614 is arranged to generate a threshold level (TH) for the comparator circuit 615. The threshold level (TH) can be adjusted by programming the DAC circuit (614) as may be desired. Comparator circuit 615 is arranged to compare VN632 to TH. For values of VN632 that are above the threshold level (VN632>TH), the comparator circuit is arranged to assert a logic 1 output signal. For values of VN632 that are below the threshold level (VN632<TH), the comparator circuit is arranged to assert a logic 0 output signal.

By using the above described differential comparison of IN1 and IN2, noise, power supply ringing, and other similar signals that would be present in a single ended system are rejected. As such, the accuracy of the comparison of the threshold level (TH) and the amplifier output signal (IN2−IN1)*G can enjoy a higher accuracy level.

Figure 7:
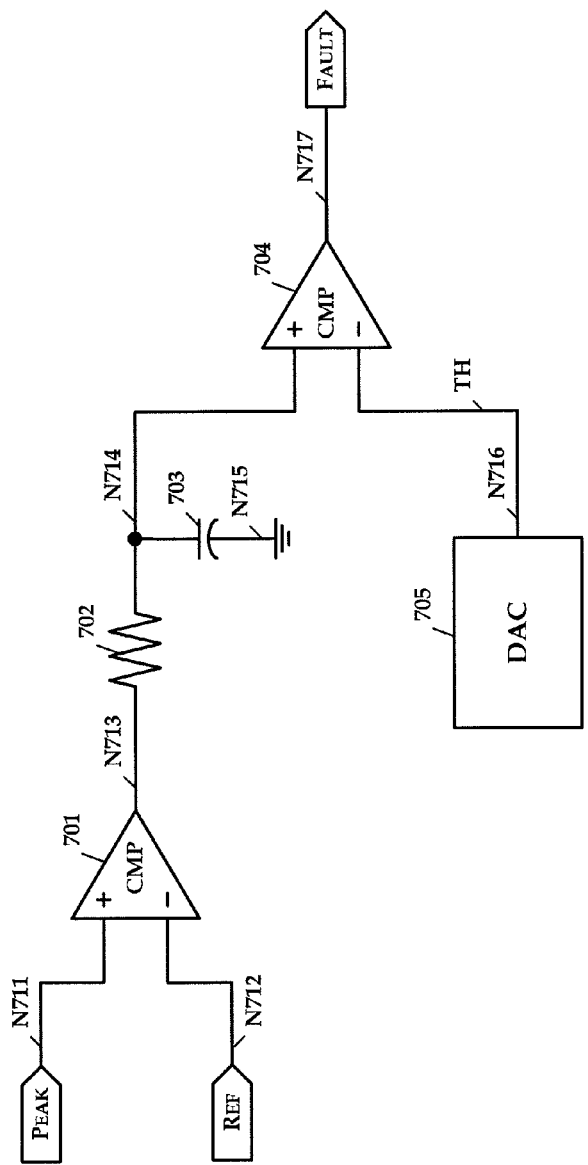
FIG. 7 is schematic diagram illustrating a fault detection circuit using an analog filter scheme.

FIG. 7 is schematic diagram illustrating a fault detection circuit (700) using an analog filter scheme, arranged in accordance with at least some aspects of the present disclosure. Fault detection circuit 700 includes a first comparator circuit (701), a resistor circuit (702), a capacitor circuit (703), a second comparator circuit (704), and a digital-to-analog converter (DAC) circuit (705).

The first comparator circuit (701) includes a non-inverting input terminal that is coupled to a first node (N711), an inverting input terminal that is coupled to a second node (N712), and an output terminal that is coupled to a third node (N713). The resistor circuit (702) is coupled between the third node (N713) and a fourth node (N714). The capacitor circuit (703) is coupled between the fourth node (N714) and a fifth node (N715). The DAC circuit (705) includes an output terminal that is coupled to a sixth node (N716). The second comparator circuit (704) includes a non-inverting input terminal that is coupled to the fourth node (N714), an inverting input terminal that is coupled to the sixth node (N716), and an output terminal that is coupled to a seventh node (N717).

In operation, a peak detection signal (PEAK) is coupled to node N711, a reference signal (REF) is coupled to node N712, and node N715 corresponds to a ground terminal. The first comparator circuit (701) asserts a signal at node N713 when the peak detection signal (PEAK) exceeds the reference signal (REF), and deasserts the signal at node N713 when the peak detection signal (PEAK) does not exceed the reference signal (REF). Resistor circuit 702 and capacitor circuit 703 cooperate with one another to provide a low-pass filter function, with an input at node N713 and an output at node N714. DAC circuit 705 is arranged to generate a threshold level (TH) for the second comparator circuit 704 at node N716. The second comparator circuit (704) is arranged to compare the output of the filter at node N714 to the threshold level (TH) at node N716. Comparator circuit 704 asserts the fault signal (FAULT) at node N717 when the signal at node N714 exceeds the threshold level (TH), and de-asserts the fault signal (FAULT) when the signal at node N714 does not exceed the threshold level (TH). The time constant of the low-pass filter can be selected such that the output of the filter at node N714 does not rapidly change. The threshold level (TH) can be adjusted by programming the DAC circuit (705) as may be desired.

Figure 8:
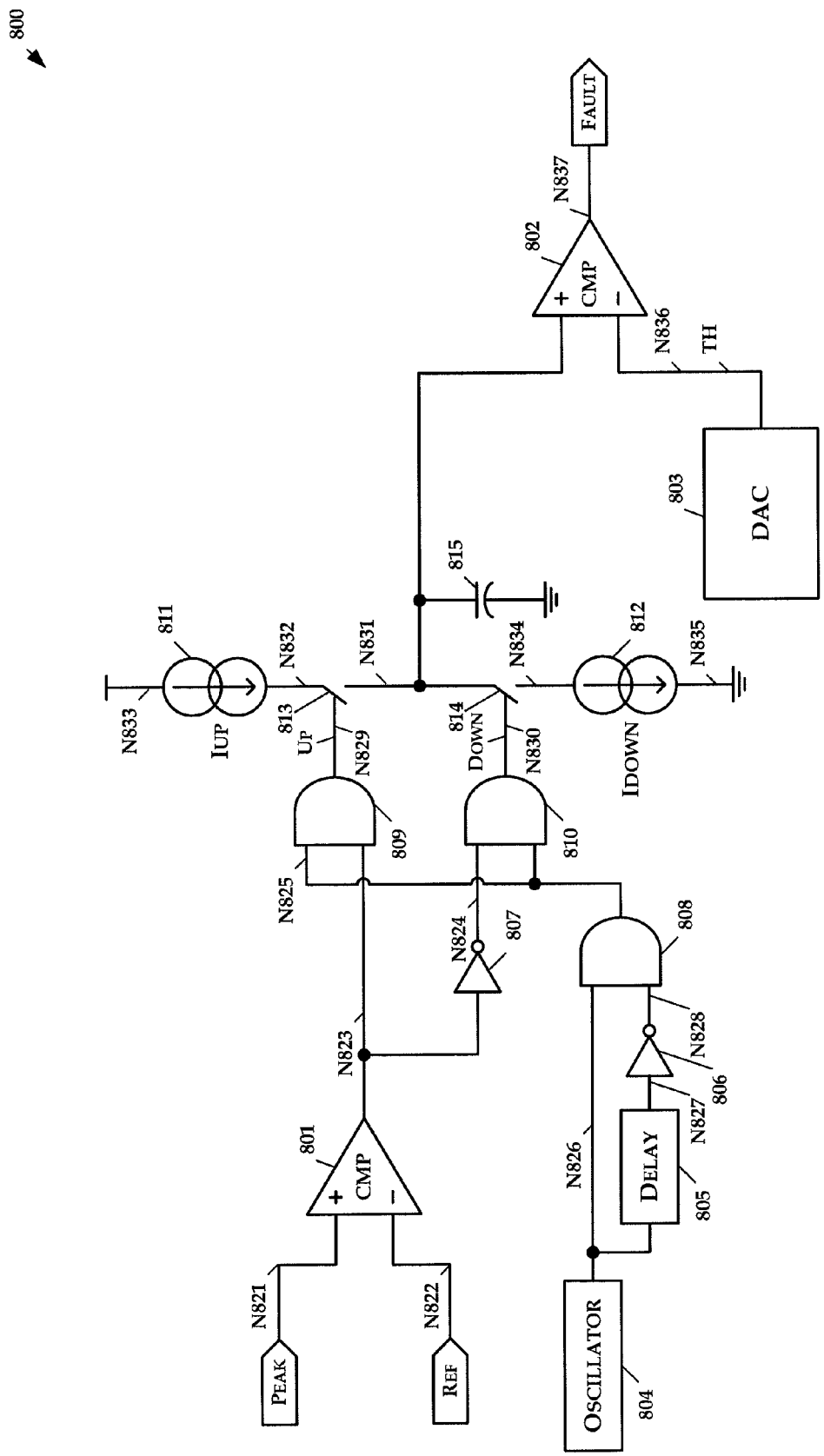
FIG. 8 is schematic diagram illustrating a fault detection circuit using a charge pump scheme, each diagram illustrating at least some features of the present disclosure.

FIG. 8 is schematic diagram illustrating a fault detection circuit (800) using a charge pump scheme, arranged in accordance with at least some features of the present disclosure. Fault detection circuit 800 includes two comparator circuits (801 and 802), a digital to analog converter (DAC) circuit (803), an oscillator circuit (804), a delay circuit (805), two inverter circuits (806 and 807), three AND logic circuits (808-810), two current sources (811 and 812), two switching circuits (813 and 814), and a capacitor circuit (815).

Comparator circuit 801 includes a non-inverting input terminal that is coupled to a first node (N821), an inverting input terminal that is coupled to a second node (N822), and an output terminal that is coupled to a third node (N823). Inverter circuit 807 is coupled between the third node (N823) and a fourth node (N824). AND logic circuit 809 includes a first input terminal coupled to the third node (N823), a second input terminal couple to a fifth node (N825), and an output terminal coupled to a ninth node (N829). AND logic circuit 810 includes a first input terminal coupled to the fourth node (N824), a second input terminal couple to the fifth node (N825), and an output terminal coupled to a tenth node (N830). Oscillator circuit 804 includes an output coupled to a sixth node (N826). Delay circuit 805 is coupled between the sixth node (N826) and a seventh node (N827). Inverter circuit 806 is coupled between the seventh node (N827) and an eighth node (N828). AND logic circuit 808 includes a first input terminal coupled to the sixth node (N826), a second input terminal couple to the eighth node (N828), and an output terminal coupled to the fifth node (N825). Switch circuit 813 includes a first terminal coupled to an eleventh node (N831), a second terminal coupled to a twelfth node (N832), and a control terminal coupled to the ninth node (N829). Switch circuit 814 includes a first terminal coupled to the eleventh node (N831), a second terminal coupled to a fourteenth node (N834), and a control terminal coupled to the tenth node (N830). Current source 811 is coupled between a thirteenth node (N833) and the twelfth node (N832). Current source 812 is coupled between the fourteenth node (N834) and a fifteenth node (N835). Capacitor circuit 815 is coupled between the eleventh node (N831) and the fifteenth node (N835). DAC circuit 803 includes an output that is coupled to a sixteenth node (N836). Comparator circuit 802 includes a non-inverting input terminal that is coupled to the eleventh node (N831), an inverting input terminal that is coupled to the sixteenth node (N836), and an output terminal that is coupled to a seventeenth node (N837).

In operation, a peak detection signal (PEAK) is coupled to node N821, a reference signal (REF) is coupled to node N822, node N833 corresponds to a positive supply terminal, node N835 corresponds to a negative power supply or ground terminal, and node N837 corresponds to a fault detection output terminal for circuit 800. The first comparator circuit (801) asserts a signal at node N823 when the peak detection signal (PEAK) exceeds the reference signal (REF), and de-asserts the signal at node N823 when the peak detection signal (PEAK) does not exceed the reference signal (REF).

The oscillator circuit (804) generates a clock signal at node N826. The delay circuit (805) and the inverter circuit (806) generate an inverted clock signal at node N828, which is delayed in time. For each transition in the clock signal at node N826, a pulse signal will be generated at the output of AND logic circuit 808, where the pulse width of the pulse signal is determined by the delay circuit (805). The pulse signal is used by AND logic circuits 809 and 810, which evaluate their inputs at nodes N823 and N824 when the pulse signal corresponds to a logic 1 value.

When the signal at node N829 is a logic 1 value, switch circuit 813 is actuated and current (IUP) flows from the positive supply terminal (N833) through current source 811 to capacitor circuit 815. When the signal at node N830 is a logic 1 value, switch circuit 814 is actuated and current (IDOWN) from current source 812 flows from capacitor circuit 815 to the negative supply terminal (node N835). The voltage at node N831 increases for each current (IUP) coupled from current source 811, and decreases for each current (IDOWN) coupled from current source 812. Capacitor circuit 815 is thus arranged to integrate the currents to generate a voltage.

DAC circuit 803 is arranged to generate a threshold level (TH) for comparator circuit 802 at node N836. Comparator circuit 802 is arranged to compare the output of the charge pump circuit at node N831 to the threshold level (TH) at node N836. Comparator circuit 802 asserts the fault signal (FAULT) at node N837 when the signal at node N831 exceeds the threshold level (TH), and de-asserts the fault signal (FAULT) when the signal at node N831 does not exceed the threshold level (TH). The rate for increasing the voltage at node N831 is determined by current value IUP, the capacitance value associated with capacitor 815, and the switching times for switch circuit 813. The rate for decreasing the voltage at node N831 is determined by current value DOWN, the capacitance value associated with capacitor 815, and the switching times for switch circuit 814. The threshold level (TH) can be adjusted by programming the DAC circuit (803) as may be desired.

Although the invention has been described herein by way of exemplary embodiments, variations in the structures and methods described herein may be made without departing from the spirit and scope of the invention. For example, the positioning of the various components may be varied. Individual components and arrangements of components may be substituted as understood to one of skill in the art having read the present disclosure. The various functions of circuits described herein may be separated or combined as required for a particular implementation. Therefore the described physical partitions of circuits and circuit components described herein may be varied to provide the same overall described functions. Since many embodiments of the invention can be made without departing from the spirit and scope of the invention, the invention resides in the claims hereinafter appended.

What is claimed is:

1. A line driver circuit comprising:
a peak detector circuit that is arranged to monitor one or more outputs of the line driver circuit, wherein the peak detector circuit is arranged to assert a peak detection signal when signals on a transmission line exceed a threshold level; and
a fault detection circuit that is arranged to monitor the peak detection signal, wherein the fault detection circuit is arranged to assert a fault condition indicating the transmission line is not properly terminated when the peak detection signal is asserted for a first length of time, and wherein the fault detection circuit is arranged to maintain the fault condition until a second length of time has expired without the peak detection signal being asserted,
wherein the peak detector circuit comprises:
a capacitor circuit that is coupled to an input terminal of the peak detector circuit
a first follower circuit that includes an input terminal that is coupled to the capacitor circuit and an output terminal;
a reference voltage source;
a second follower circuit that includes an input terminal that is coupled to the reference voltage source and an output terminal; and
a comparator circuit that includes a first input terminal that is coupled to the output terminal of the first follower circuit, a second input terminal that is coupled to the output terminal of the second follower circuit, and an output terminal that is coupled to an output terminal of the peak detector circuit.

2. The line driver circuit of claim 1, wherein the first follower circuit comprises:
a current source that is coupled between the output terminal of the first follower circuit and a lower power supply node; and
a transistor that includes a first terminal coupled to a higher power supply node, a second terminal comprising the output terminal of the first follower circuit, and a control terminal comprising the input terminal of the first follower circuit.

3. The line driver circuit of claim 2, wherein the second follower circuit comprises:
a second current source that is coupled between the output terminal of the second follower circuit and the lower power supply node; and
a second transistor that includes a first terminal coupled to the higher power supply node, a second terminal comprising the output terminal of the second follower circuit, and a control terminal comprising the input terminal of the second follower circuit;
wherein the first transistor and the second transistor are matched to one another.

4. The line driver circuit of claim 1, wherein the peak detector circuit comprises:
a first capacitor circuit that is coupled to a first input terminal of the peak detector circuit;
a second capacitor circuit that is coupled to a second input terminal of the peak detector circuit;
a first follower circuit that includes an input terminal that is coupled to the first capacitor circuit and an output terminal;

a second follower circuit that includes an input terminal that is coupled to the second capacitor circuit and an output terminal;
a first resistor circuit that is coupled to the output terminal of the first follower circuit;
a second resistor circuit that is coupled to the first resistor circuit;
a third resistor circuit that is coupled to the output terminal of the second follower circuit;
a fourth resistor circuit that is coupled to the third resistor circuit;
an amplifier circuit that includes a non-inverting input terminal that is coupled between the third and fourth resistor circuits, an inverting input terminal that is coupled between the first and second resistor circuits, and an output terminal that is coupled to the second resistor circuit; and
a comparator circuit that includes a non-inverting input terminal that is coupled to the output terminal of the amplifier circuit, an inverting input terminal that is configured to receive a threshold level signal for the peak detector circuit, and an output terminal that is coupled to an output of the peak detector circuit.

5. The line driver circuit of claim 1, further comprising:
a digital-to-analog converter (DAC) circuit that is arranged to generate the threshold level.

6. The line driver circuit of claim 1, wherein the fault detection circuit comprises one of: a digital filter circuit and an analog filter circuit.

7. The line driver circuit of claim 1, wherein the fault detection circuit comprises:
an up/down counter circuit that is arranged to generate a counter output that changes in value in response to a counter clock signal and the peak detection signal, wherein the up/down counter is arranged to increase the value of the counter output when the peak detection signal is asserted, and wherein the up/down counter is arranged to decrease the value of the counter output when the peak detection signal is deasserted;
a minimum count detection logic that is arranged to assert a minimum detection signal when the value of the counter output is below a minimum count threshold, the minimum count detection logic also arranged to de-assert the minimum detection signal when the value of the counter output is above the minimum count threshold;
a maximum count detection logic that is arranged to assert a maximum detection signal when the value of the counter output is above a maximum count threshold, the maximum count detection logic also arranged to de-assert the maximum detection signal when the value of the counter output is below the minimum count threshold; and
a control logic that is arranged to monitor the minimum detection signal and the maximum detection signal, wherein the control logic is arranged to assert the fault condition when the maximum detection signal is asserted and to de-assert the fault condition when the minimum detection signal is asserted.

8. The line driver circuit of claim 1, wherein the fault detection circuit comprises:
a first comparator circuit that includes a first input terminal that is configured to receive the peak detection signal, a second input terminal that is configured to receive a reference signal, and an output terminal, wherein the first comparator circuit is configured to assert an output signal on its output terminal when the peak detection signal exceeds the reference signal;
a resistor circuit that is coupled to the output terminal of the first comparator circuit;
a capacitor circuit that is coupled between the resistor circuit and a circuit ground; and
a second comparator circuit that includes a first input terminal that is coupled to a filter formed by the resistor circuit and the capacitor circuit, a second input terminal that is configured to receive a threshold level signal, and an output terminal, wherein the second comparator circuit is configured to assert the fault condition on its output terminal when the peak detection signal exceeds the reference signal for a time period set by a time constant of the filter.

9. The line driver circuit of claim 8, further comprising:
a digital-to-analog converter (DAC) circuit that is arranged to generate the threshold level signal.

10. The line driver circuit of claim 1, wherein the fault detection circuit comprises:
a first comparator circuit that is arranged to assert a first signal when the peak detection signal exceeds a reference signal and to de-assert the first signal when the peak detection signal is below the reference signal;
a charge pump control logic that is arranged to assert one of an up control signal and a down control signal in response to the first signal, wherein the up control signal and the down control signal are not asserted at a same time;
a charge pump circuit that is arranged to source a first current when the up control signal is asserted and to sink a second current when the down control signal is asserted;
a capacitor circuit that is arranged to generate a second signal by integrating the first and second currents such that the second signal increases in value when the charge pump circuit sources the first current to the capacitor circuit and decreases in value when the charge pump circuit sinks the second current from the capacitor circuit; and
a second comparator circuit that is arranged to assert the fault condition when the second signal exceeds a threshold level signal and to de-assert the fault condition when the second signal is below the threshold level signal.

11. The line driver circuit of claim 10, further comprising:
a digital-to-analog converter (DAC) circuit that is arranged to generate the threshold level signal.

12. The line driver circuit of claim 10, wherein the first current and the second current are one of: matched in magnitude to one another and scaled in magnitude relative to one another.

* * * * *